United States Patent (10) Patent No.: US 6,171,902 B1
Ida (45) Date of Patent: Jan. 9, 2001

(54) METHOD OF FORMING A DRAM CYLINDER SHAPED CAPACITOR

(75) Inventor: Jiro Ida, Minato-ku (JP)

(73) Assignee: Oki Electric Industry Co., Ltd., Tokyo (JP)

(*) Notice: Under 35 U.S.C. 154(b), the term of this patent shall be extended for 0 days.

(21) Appl. No.: 09/048,311

(22) Filed: Mar. 26, 1998

(30) Foreign Application Priority Data

Jun. 26, 1997 (JP) .................................................. 9-170001

(51) Int. Cl.⁷ ................................................ H01L 21/8242
(52) U.S. Cl. ......................... 438/254; 438/238; 438/253; 438/396; 438/397; 438/694; 438/713; 438/723; 438/724; 438/978
(58) Field of Search .................................... 438/238, 253, 438/254, 396, 397, 694, 713, 723, 724, 978

(56) References Cited

U.S. PATENT DOCUMENTS

| 5,330,930 | * | 7/1994 | Chi. | |
| 5,434,439 | * | 7/1995 | Ajika et al. | 257/309 |
| 5,567,640 | * | 10/1996 | Tseng. | |
| 5,631,484 | * | 5/1997 | Tsoi et al. | 257/341 |
| 5,635,423 | * | 6/1997 | Huang et al. | 437/195 |
| 5,780,339 | * | 7/1998 | Liu et al. | 438/253 |
| 5,807,780 | * | 9/1998 | Davis et al. | 438/311 |
| 5,811,331 | * | 9/1998 | Ying et al. | 438/253 |
| 5,854,119 | * | 12/1998 | Wu et al. | 438/396 |
| 5,914,279 | * | 6/1999 | Yang et al. | 438/724 |
| 5,915,189 | * | 6/1999 | Sim | 438/397 |
| 5,935,762 | * | 8/1999 | Dai | 430/312 |
| 5,956,587 | * | 8/1999 | Chen et al. | 438/255 |
| 6,015,733 | * | 1/2000 | Lee et al. | 438/253 |

OTHER PUBLICATIONS

Wolf, Stanley, "Silicon processing for the VLSI Era, vol. 11—Process Intergration." Lattice Press, 1990, pp. 197.*

* cited by examiner

Primary Examiner—John F. Niebling
Assistant Examiner—Jennifer M. Kennedy
(74) Attorney, Agent, or Firm—Jones Volentine, L.L.C.

(57) ABSTRACT

A semiconductor device and a manufacturing method for a hyperfine structure wherein contact of a gate electrode with a side-wall composed of a silicon nitride layer within a contact hole due to an alignment deviation may be prevented. The semiconductor device is structured such that the contact hole is formed in an inter-layer insulating layer and the side-wall is formed along a wall surface within the contact hole. A bottom of the side-wall is composed of a silicon oxide layer or a silicon oxide nitride layer, and an upper portion of the side-wall is formed of a silicon nitride layer.

7 Claims, 3 Drawing Sheets

METHOD OF FORMING A DRAM CYLINDER SHAPED CAPACITOR

BACKGROUND OF THE INVENTION

1. Field of the Invention

The present invention relates to a semiconductor device represented by a DRAM (Dynamic Random Access Memory), and to a manufacturing method thereof.

2. Description of the Related Art

In recent years, more downsizing and a higher integration of a semiconductor device have been tried for their attainment, and, therewith, individual device elements such as wiring etc have been increasingly made hyperfine. From such a trend, however, when forming, e.g., a contact hole, it becomes impossible to ensure a sufficient allowance in alignment between the contact hole and an electrode (a conductive part) of a lower layer due to the hyperfine structure. Hence, there has been adopted a method by which after the contact hole has been formed normally by a self-alignment or so formed as to have a large aperture, a side-wall is formed of an insulating layer within this contact hole, and the alignment allowance is taken by substantially reducing the contact hole.

Further, in the case of a DRAM as a semiconductor device, with a reduced cell area due to the hyperfine structure, as shown in FIG. 3(g), there has been adopted a so-called cylinder type electrode structure in which a capacitor electrode is formed upright enough to obtain a larger surface area.

For forming this cylinder type electrode structure, as illustrated in FIG. 3(a), a contact hole 2 is formed with an aperture within an inter-layer insulating layer 1, and thereafter polysilicon 3 is deposited inwardly of the contact hole 2 so that the contact hole 2 is filled with the polysilicon 3. Note that the reference numeral 8 designates a gate electrode, and 7 represents a silicon nitride layer. Subsequently, the polysilicon 3 is etched-back with the result that, as shown in FIG. 3(b), only the polysilicon 3a embedded into the contact hole 2 is left. Subsequently, the silicon oxide layer is deposited on the entire surface, and further this is subjected to patterning, thereby forming a recessed portion 4 for forming a cylinder as illustrated in FIG. 3(c).

Then, as shown in FIG. 3(d), side polysilicon 5 is deposited over the whole surface, and subsequently a silicon oxide layer is deposited thereon. Then, this silicon oxide layer is etched-back and thus left only in the recessed portion 4 as shown in FIG. 3(e).

Next, the polysilicon 5 is partially removed by etching it back, thereby forming a bottomed cylindrical polysilicon 5a as illustrated in FIG. 3(f). Thereafter, a silicon oxide layer 6 left in the recessed portion 4 and the silicon oxide layer forming the recessed portion 4 are removed by etching, thereby obtaining a cylinder type electrode structure shown in FIG. 3(g), i.e., a lower electrode structure of a cylinder type capacitor.

Incidentally, according to the cylinder type electrode structure, the side-wall 7 is formed in order to substantially reduce the contact hole 2. This side-wall 7, however, generally involves the use of a silicon nitride layer (SiN) exhibiting a high covering property even in a minute hole.

In the case of using the silicon nitride layer as the side-wall 7, however, as shown in FIG. 3(h), if a contact deviation occurs, it follows that the side-wall 7 comes into a direct contact with a gate electrode 8 and a field edge (unillustrated). Consequently, there arises such an inconvenience that a transistor characteristic fluctuates due to a stress in the silicon nitride layer, hydrogen in this layer and further an interface level etc, or that a junction leak current increases.

Moreover, in the DRAM having the above cylinder type electrode structure, the polysilicon 3a embedded into the contact hole 2 and the polysilicon 5a constituting a part of the cylinder portion are separately formed and hence microscopically discontinuous. Therefore, there might be a possibility in which the polysilicon 5a becoming a lower electrode of the cylinder type capacitor in the cylinder type electrode structure exfoliated from the contact composed of the polysilicon 3a embedded into the contact hole 2 when in, e.g., cleaning and spin-dry processes.

Furthermore, the manufacturing method of the above cylinder type electrode structure presents a drawback to be ameliorated, wherein the manufacturing process is complicated such as depositing the polysilicon twice.

SUMMARY OF THE INVENTION

It is a primary object of the present invention, which was contrived under such circumstances, to provide a semiconductor device and a manufacturing method thereof that are capable of further advancing a hyperfine structure by obviating such an inconvenience that a side-wall composed of a silicon nitride layer used in a contact hole contacts a gate electrode etc due to an alignment deviation, and a semiconductor device and a manufacturing method thereof that are capable of simplifying a manufacturing process as well as of obviating such an inconvenience that a lower electrode of a cylinder type capacitor is exfoliated from a contact within a contact hole.

To accomplish the above object, according to a first aspect of the present invention, a semiconductor device constructed such that a contact hole is formed in an inter-layer insulating layer, a side-wall is formed along a wall surface within the contact hole and has its bottom composed of a silicon oxide layer or a silicon oxide nitride layer, and an upper portion of the silicon oxide layer or the silicon oxide nitride layer is formed of a silicon nitride layer.

According to this semiconductor device, the bottom of the side-wall is composed of the silicon oxide layer or the silicon oxide nitride layer. The side-wall bottom is composed of the silicon oxide layer or the silicon oxide nitride layer, and accordingly the portion contacting the gate electrode is formed of the silicon oxide layer or the silicon oxide nitride layer. Therefore, even if the side-wall comes into a direct contact with the gate electrode, the silicon nitride layer existing on the upper portion of the silicon oxide layer or the silicon oxide nitride layer does not directly contact the gate electrode.

According to a second aspect of the present invention, a method of manufacturing a semiconductor device comprises a step of forming a contact hole in an inter-layer insulating layer on a silicon substrate, which communicates with the silicon substrate, a step of next forming a silicon oxide layer or a silicon oxide nitride layer on a surface of the silicon substrate that faces inwardly of the contact hole, a step of subsequently forming a silicon nitride layer over an entire surface on the silicon substrate, and a step of thereafter executing an anisotropic etching process on the silicon nitride layer, executing the anisotropic etching process on the silicon oxide layer or the silicon oxide nitride layer on the surface of the silicon substrate within the contact hole, and thereby forming a side-wall composed of a silicon nitride layer and a silicon oxide layer or a silicon oxide nitride layer within the contact hole.

According to this manufacturing method, the silicon oxide layer or the silicon oxide nitride layer is provided on the surface of the silicon substrate that faces inwardly of the contact hole. Further, after forming the silicon nitride layer over the entire surface, the side-wall composed of the silicon nitride layer and the silicon oxide layer or the silicon oxide nitride layer is formed within the contact hole by executing the anisotropic etching process on the silicon nitride layer and the silicon oxide layer or the silicon oxide nitride layer. Therefore, even if the contact deviation occurs with the result that the gate electrode faces inwardly of the contact hole, because of the silicon nitride layer being formed after the silicon oxide layer or the silicon oxide nitride layer has been formed within the contact hole, there is eliminated a possibility in which the silicon nitride layer forming the side-wall does not directly contact the gate electrode.

According to a third aspect of the present invention, a semiconductor device is of a DRAM type having a cylinder type capacitor. A contact portion is embedded into a contact hole through which a lower electrode of the cylinder type capacitor communicates with a conductive portion of a silicon substrate. The contact portion electrically connects the lower electrode to the conductive portion. This contact portion and the lower electrode of the cylinder type capacitor are continuously integrally formed.

According to this semiconductor device, the contact portion in the contact hole and the lower electrode of the cylinder type capacitor are continuously integrally formed, and hence there is eliminated such an inconvenience that the lower electrode is exfoliated from the contact when in, e.g., cleaning and spin-dry processes.

According to a fourth aspect of the present invention, a method of manufacturing a semiconductor device, when manufacturing a DRAM type semiconductor device having a cylinder type capacitor, comprises, to start with, a step of forming a contact hole communicating with a conductive portion of a silicon substrate, in an inter-layer insulating layer on a silicon substrate, a step of next forming an upper layer on the inter-layer insulating layer in the contact hole in a state where there is no embedding into the contact hole, a step of subsequently forming a recessed portion having an aperture larger than an aperture of the contact hole by etching the upper layer in such a state that the aperture of the contact hole faces to the outside, a step of removing the upper layer within the contact hole, and a step of thereafter forming a conductive layer in a state of being embedded into the contact hole as well as of covering an internal surface of the recessed portion.

According to this manufacturing method, the recessed portion is formed in the state where the aperture of the contact hole faces to the outside, and thereafter the conductive layer is formed in the state of being embedded into the contact hole as well as of covering the internal surface of the recessed portion. Hence, the etching process is executed so that there is left the portion covering the internal surface of the recessed portion in the obtained conductive layer, whereby this portion covering the internal surface of the recessed portion can be used as a lower electrode of the cylinder type capacitor. In this case, the lower electrode and the contact composed of the conductive layer embedded into the contact hole are continuously integrally formed.

Further, according to this manufacturing method, the embedding of the conductive layer into the contact hole and into the recessed portion is done by the single process. Therefore, the single patterning process by etching-back for forming the lower electrode and the contact may suffice. Accordingly, the manufacturing process can be more simplified than by the prior art.

BRIEF DESCRIPTION OF THE DRAWINGS

Other objects and advantages of the present invention will become apparent during the following discussion in conjunction with the accompanying drawings, in which:

FIGS. 1(a)–1(c) are explanatory sectional views of a principal portion, showing a manufacturing method in sequence of processes; FIG. 1(d) is an explanatory side sectional view of the principal portion, showing an operation and an effect;

FIGS. 3(a)–3(g) are explanatory sectional views showing the manufacturing method in sequence of processes; FIG. 3(h) is an explanatory side sectional view of the principal portion, showing a problem inherent in the prior art.

DETAILED DESCRIPTION OF THE PREFERRED EMBODIMENTS

Figure 1:
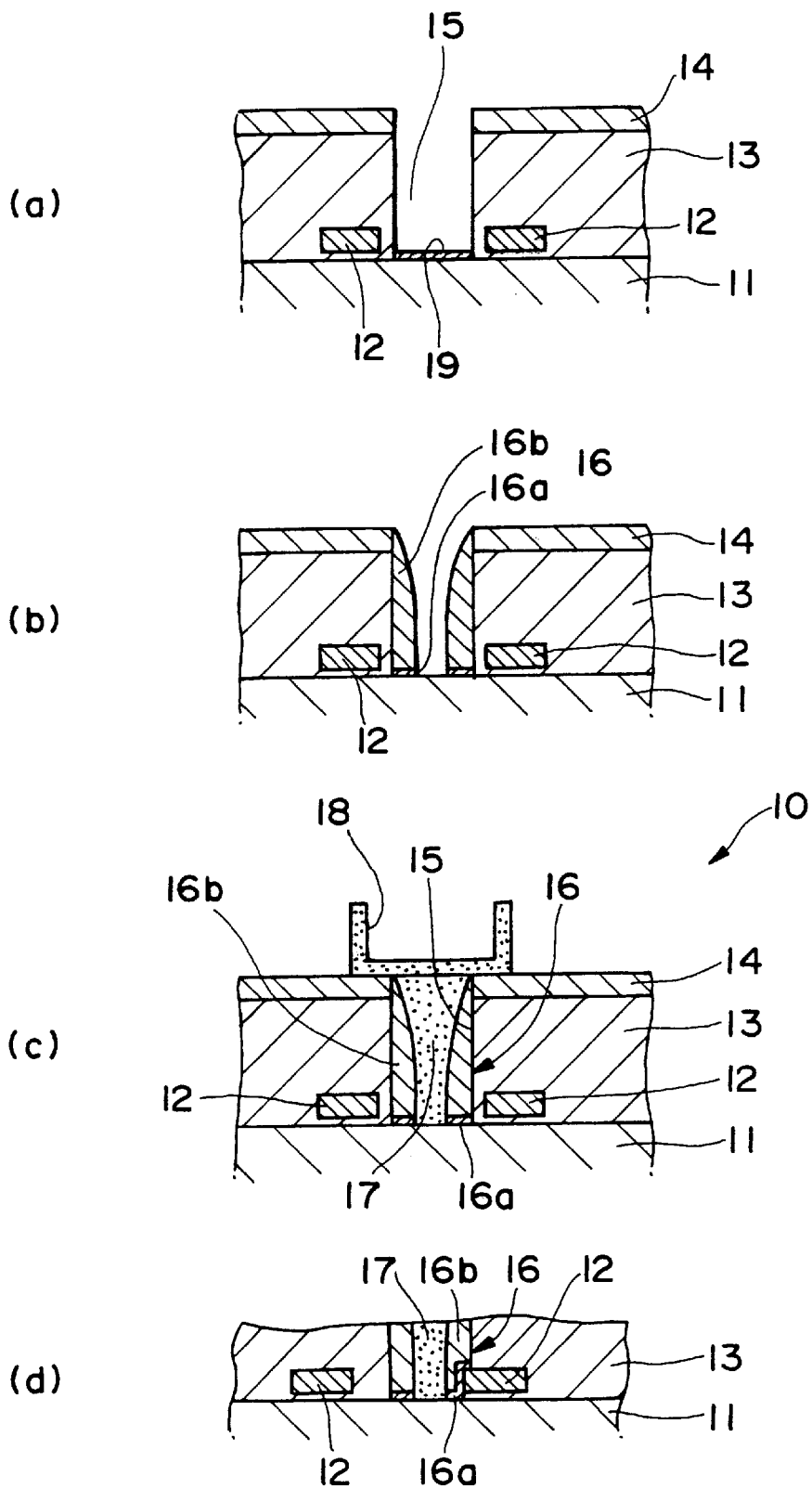
FIGS. 1(a)–1(d) are explanatory views showing one embodiment of a first semiconductor device according to the present invention.

The present invention will hereinafter be described in details.

FIG. 1(c) is a view showing one embodiment of a first semiconductor device of the present invention. Referring to FIG. 1(c), the numeral 10 denotes a semiconductor device (a DRAM) having a cylinder type electrode structure. In this semiconductor device 10, a gate electrode 12 is formed on a silicon substrate 11. Further an inter-layer insulating layer 13 composed of a silicon oxide layer is formed covering the gate electrode 12, and a silicon nitride layer 14 is formed in this sequence. A contact hole 15 communicating with a conductive portion (unillustrated) in the silicon substrate 11 is formed in the silicon nitride layer 14 as well as in the inter-layer insulating layer 13. A side-wall 16 is formed within this contact hole 15 along a wall surface thereof.

This side-wall 16 includes a bottom 16a composed of a thin silicon oxide layer, and an upper portion 16b of the silicon nitride layer, i.e., a portion occupying a large proportion of the side-wall 16 is composed of a silicon nitride layer. Then, owing to the formation of this side-wall 16, a capacity (an inside diameter) of the contact hole 15 is substantially reduced. Note that a large proportion of the side-wall 16 is composed of the silicon nitride layer exhibiting a high covering property, and hence the internal wall surface of the contact hole 15 is in such a state as to be surely covered with the side-wall 16.

Further, a contact 17 composed of polysilicon is embedded inwardly of the side-wall 16 within the contact hole 15. Then, a lower electrode 18 of a cylinder type capacitor is formed on the silicon nitride layer 14 in such a state as to be connected to the contact 17.

Given next is an explanation of a method of manufacturing a semiconductor device 10 having the thus constructed cylinder type electrode structure.

To begin with, as in the prior art, a gate oxide layer (unillustrated) and a gate electrode 12 are formed on the surface of a silicon substrate 11, and further a silicon oxide layer is deposited on the order of 1 μm thick by a CVD method so as to cover the gate electrode 12, thereby forming an inter-layer insulating layer 13. Subsequently, a silicon nitride layer 14 is deposited on the order of 100 nm thick by a plasma CVD method etc on this inter-layer insulating layer 13.

Next, the silicon nitride layer 14 and the inter-layer insulating layer 13 are formed with a aperture by a known photolithography/etching technology, thus forming a contact hole having an aperture diameter of approximately 0.3 μm as shown in 1(*a*).

Subsequently, a silicon oxide layer 19 is formed by thermal oxidation at 800° C. for approximately 30 minutes on the order of 10 nm thick on the bottom of the contact hole 15, i.e., on the surface of the silicon substrate 11 facing inwardly of the contact hole 15. Herein, the silicon oxide layer 19 is thus formed by the thermal oxidation, thereby making it feasible to form the silicon oxide layer 19 selectively only within the contact hole 15 without oxidizing the portion covered with the inter-layer insulating layer 13 and the silicon nitride layer 14 on the silicon substrate 11, accordingly without forming the silicon oxide layer on an unnecessary area.

Subsequently, a silicon nitride layer is deposited over the entire surface on the order of 100 nm thick by a low-pressure CVD method or a plasma CVD method etc. Then, an upper portion 16*b* composed of the silicon nitride layer and a bottom 16*a* composed of the silicon oxide layer are formed within the contact hole 15 by executing an anisotropic etching process simultaneously or continuously with forming this silicon nitride layer and the previously formed silicon oxide layer 19, thereby obtaining the side-wall 16.

Figure 3:
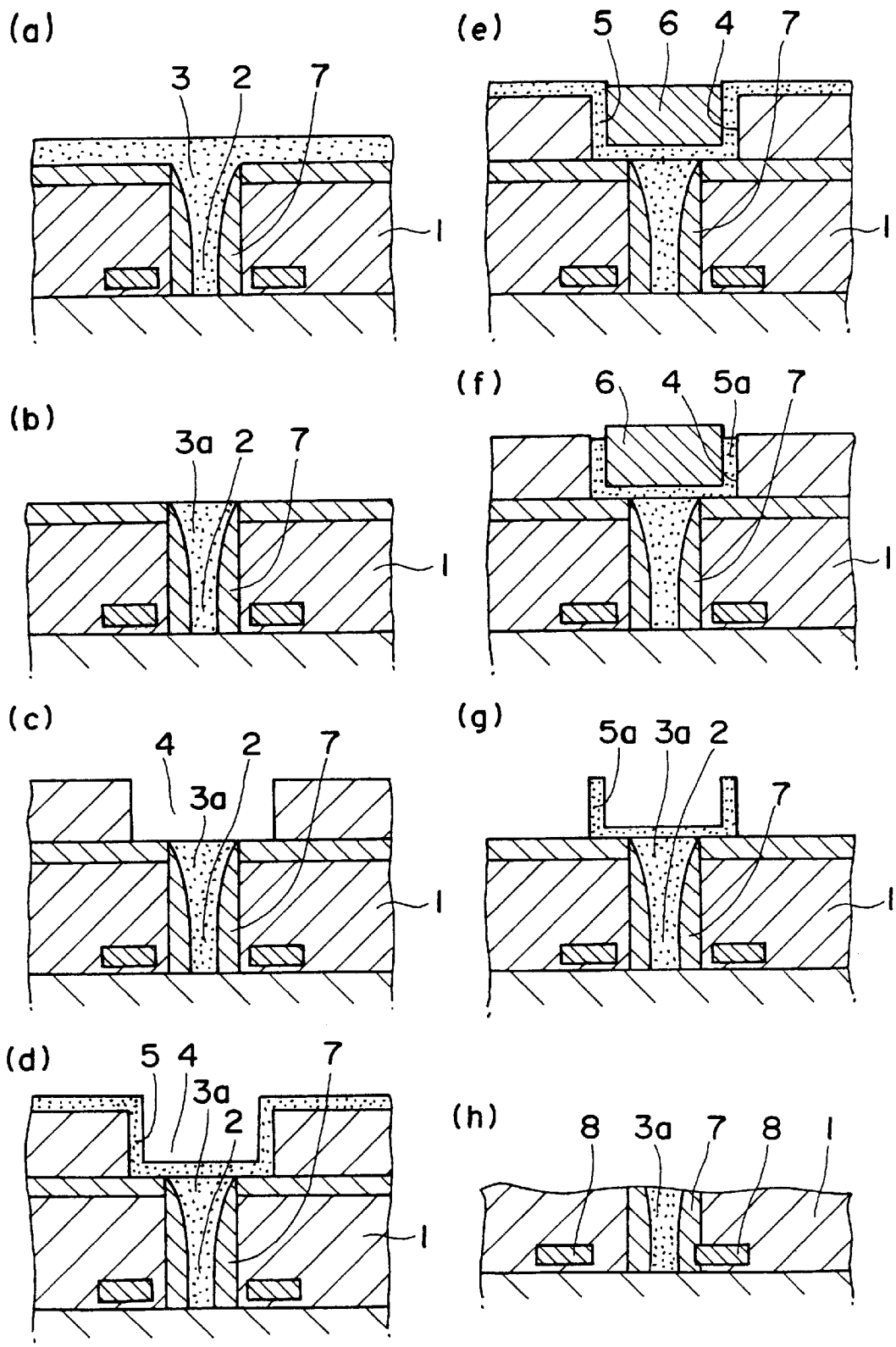
FIGS. 3(a)–3(h) are explanatory views showing one embodiment of a prior art semiconductor device.

Thereafter, the contact 17 composed of polysilicon doped with an impurity is embedded into the contact hole 15 by the same method as the prior art shown in FIGS. 3(*a*)–3(*h*), and further the cylinder type capacitor lower electrode 18 composed of polysilicon doped with the impurity is formed, thereby obtaining the cylinder type electrode structure shown in FIG. 1(*c*).

In the thus obtained semiconductor device 10, the bottom 16*a* of the side-wall 16 is composed of the silicon oxide layer, and hence, even if the contact deviation occurs when manufactured with the result that the side-wall 16 directly contacts the gate electrode 12 as shown in FIG. 1(*d*), the silicon nitride layer provided above the silicon oxide layer does not come into a direct contact with the gate electrode etc because of the contact portion with the gate electrode 12 being the bottom portion 16*a* composed of the silicon oxide layer. Accordingly, it is possible to prevent such inconveniences that a transistor characteristic of the semiconductor device 10 fluctuates due to a stress in the silicon nitride layer, the hydrogen existing in this silicon nitride layer and further the interface level etc and that the junction leak current increases.

Further, according to the method described above, even if the contact deviation happens enough to cause the gate electrode 12 to face inwardly of the contact hole 15, the silicon nitride layer is formed after the silicon oxide layer 19 has been formed within the contact hole 15, thereby eliminating the possibility in which the silicon nitride layer structuring the side-wall 16 comes into a direct contact with the gate electrode 12. As discussed above, it is feasible to prevent such inconveniences that the transistor characteristic of the semiconductor device 10 fluctuates and that the junction lean current augments.

Note that the silicon oxide layer constituting the bottom 16*a* of the side-wall 16 is formed by the thermal oxidization in this embodiment. The present invention is not, however, limited to this method but may adopt, e.g., a low-pressure CVD method by which the silicon oxide layer can be formed. In this case, the silicon oxide layer formed based on the low-pressure CVD method is excellent in terms of its coverage, and therefore, even if the gate electrode 12 might face inwardly of the contact hole 15, this gate electrode 12 can be surely covered with the silicon oxide layer.

Moreover, the bottom 16*a* of the side-wall 16 is formed of the silicon oxide layer in this embodiment but may be, instead of this, formed of the silicon nitride oxide layer.

Figure 2:
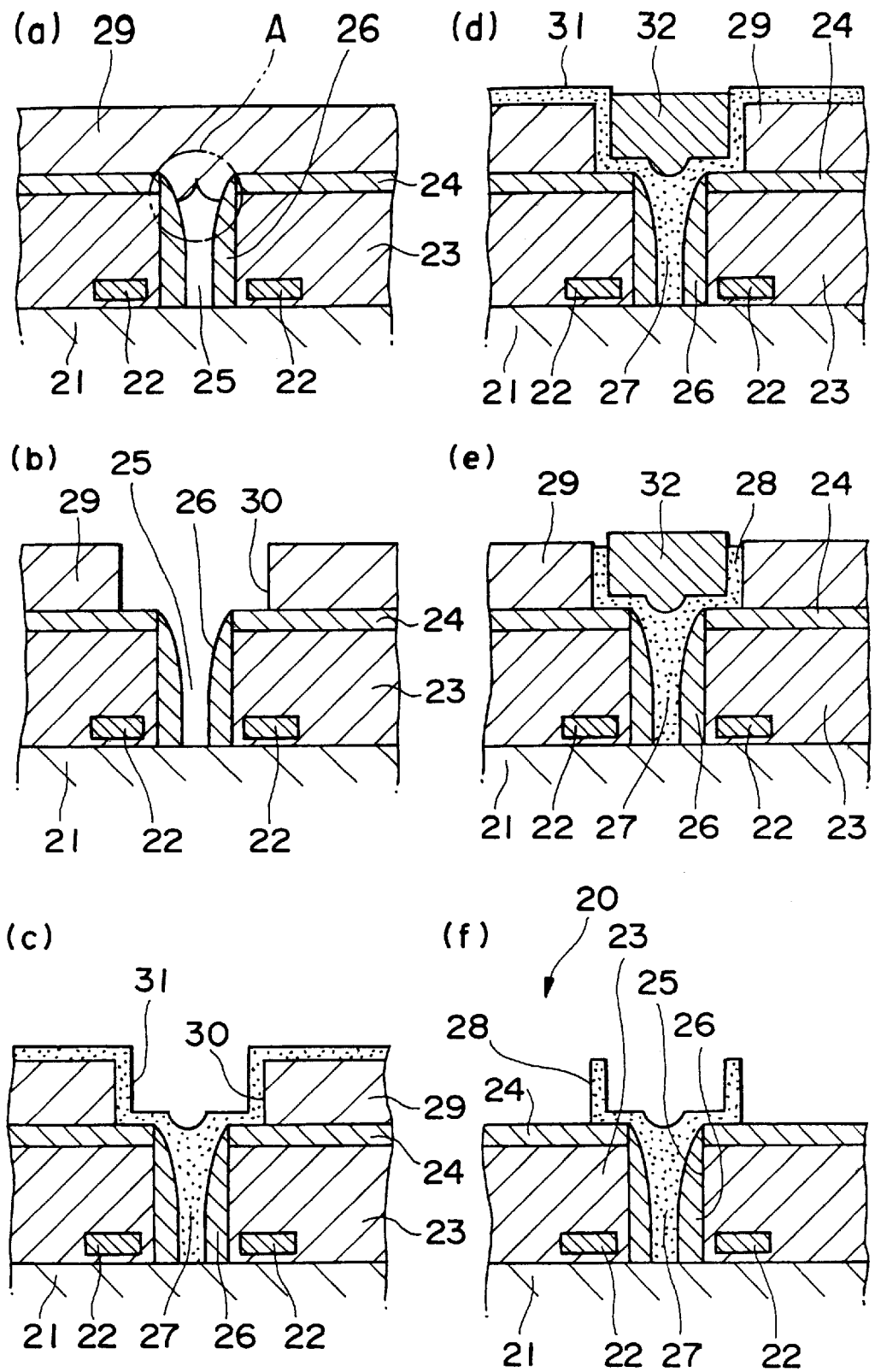
FIGS. 2(a)–2(f) are explanatory sectional views showing one embodiment of a second semiconductor device according to the present invention as well as showing a manufacturing method in sequence of processes.

FIG. 2(*f*) is a view showing one embodiment of a second semiconductor device according to the present invention. Referring to FIG. 2(*f*), the numeral 20 represents a semiconductor device (a DRAM) having a cylinder type electrode structure. In this semiconductor device 20, a gate electrode 22 is formed on a silicon substrate 11 as in the case of the semiconductor device 10 shown in FIG. 1(*c*). Further an inter-layer insulating layer 23 composed of the silicon oxide layer is formed covering the gate electrode 22, and a silicon nitride layer 24 is formed in this sequence. A contact hole 25 communicating with a conductive portion (unillustrated) in the silicon substrate 21 is formed in the silicon nitride layer 24 as well as in the inter-layer insulating layer 23. A side-wall 26 composed of the silicon nitride layer is formed within this contact hole 25 along a wall surface thereof.

A contact 27 composed of polysilicon doped with an impurity is embedded inwardly of the side-wall 26 within the contact hole 25. Formed on this contact 27 is a cylinder type capacitor lower electrode 28 composed of polysilicon doped also with the impurity so that the electrode 28 is continuously integral with the contact 27 in a state of being formed on the silicon nitride layer 24.

Given next is an explanation of a method of manufacturing the semiconductor device 20 having the thus constructed cylinder type electrode structure.

To start with, as in the prior art, a gate oxide layer (unillustrated) and a gate electrode 22 are formed on the surface of the silicon substrate 21, and further the silicon oxide layer is deposited on the order of 1 μm thick by the CVD method so as to cover the gate electrode 22, thereby forming an inter-layer insulating layer 23. Subsequently, a silicon nitride layer 24 is deposited on the order of 100 nm thick by the plasma CVD method etc on this inter-layer insulating layer 23. Herein, as will be mentioned later on, the silicon nitride layer 24 functions as an etching stopper when removing an upper layer of the silicon oxide layer by etching.

Next, the silicon nitride layer 24 and the interlayer insulating layer 23 are formed with an aperture by the known photolithography/etching technology, thus forming a contact hole 25.

Subsequently, a silicon nitride layer is deposited over the entire surface on the order of 100 nm thick by the low-pressure CVD method or the plasma CVD method etc. Then, this silicon nitride layer is subjected to the anisotropic etching process, thereby obtaining the side-wall 26 composed of the silicon nitride layer within the contact hole 25.

Subsequently, as shown in FIG. 2(*a*), an upper layer 29 composed of the silicon oxide layer is deposited on the order of 50 nm thick over the entire surface of the silicon substrate 21 by the CVD method in a state of not being embedded into the contact hole. Herein, for the purpose of preventing the upper layer 29 from entering the interior of the contact hole 25, a CVD condition is that, e.g., silane (SiH4) is used as a raw gas, and that phosphorus is doped within a range of 7 wt % or above to 14 wt % or under. Namely, if the silicon oxide layer doped with phosphorus is formed under the above condition, the coverage of the silicon oxide layer declines, and, as indicated by A in FIG. 2(a), the silicon oxide layer (the upper layer 29) is restricted from entering therein. Note that the reason why a phosphorus doping quantity is set within the above range is that a deposition rate can be made approximate to the one in the case of vapor reaction if set in the above range, whereby the coverage might decline.

Next, the upper layer 29 is formed with an aperture by the photolithography/etching technology, and, as shown in FIG. 2(b), a recessed portion 30 having a larger aperture than the aperture of the contact hole 25 is formed. Further, the upper layer 29 deposited inwardly of the contact hole 25 is removed by etching, wherein the side-wall 26 in the contact hole 25 serves as an etching stopper, thereby making the aperture of the contact hole 25 face to the outside within the recessed portion 30.

Subsequently, polysilicon doped with the impurity is deposited on the order of 50 nm thick over the entire surface of the silicon substrate 21 by the low-pressure CVD method etc, and as shown in FIG. 2(c) a conductive layer 31 is formed in state of being embedded into the contact hole 25 as well as of covering the internal surface of the recessed portion 30. The conductive layer 31 is thus formed in the state of being embedded into the contact hole 25, whereby the contact composed of the conductive layer 31 is formed in the contact hole 25. Note that the side-wall 26 is formed of the silicon nitride layer, and hence the upper area on the silicon substrate 21 can be cleaned by hydrofluoric acid etc without changing a configuration of the contact hole 25 in advance of forming the above polysilicon layer. When thus cleaned, the conductive portion (unillustrated) of the silicon substrate 21 can be connected to the contact 27 with a good contact characteristic.

Next, the silicon oxide layer is formed over the whole surface of the silicon substrate 21 by the CVD method and further etched-back, whereby a silicon oxide layer 32 is, as shown in FIG. 2(d), left only within the recessed portion 30 while the conductive layer 31 is exposed in other areas.

Subsequently, the exposed conductive layer 31 is etched-back, thus removing the conductive layer 31 existing on the upper layer 29 as illustrated in FIG. 2(e). The lower electrode 28 of the cylinder type capacitor is thereby formed along the internal surface of the recessed portion 30.

Thereafter, wet etching is carried out by use of hydrofluoric acid with the silicon nitride layer 24 serving as an etching stopper, and, as illustrated in FIG. 2(f), the upper layer 29 and the silicon oxide layer 32 are removed. Furthermore, as in the prior art, the electrode and the wires etc (unillustrated) are formed, thereby obtaining the semiconductor device 20.

In the thus obtained semiconductor device 20, the contact 27 within the contact hole 25 and the lower electrode 28 of the cylinder type capacitor are continuously integrally formed by the single polysilicon depositing process, and hence there is eliminated such a possibility that the lower electrode 28 is exfoliated from the contact 27 when in the processes such as, e.g., cleaning and spin drying. As a matter of course, a contact characteristic between the contact 27 and the lower electrode 29 is extremely preferable.

Furthermore, according to the above method, the contact 27 and the lower electrode 28 of the cylinder type capacitor can be easily formed integrally in continuation, and besides the embedding of the conductive layer 31 into the contact hole 25 and into the recessed portion 30 is done by one process. Therefore, the single patterning process based on the etching-back etc for forming the contact 27 may suffice, and accordingly the manufacturing process thereof can be more simplified than by the prior art.

Note that the side-wall 26 is composed of the silicon nitride layer in the embodiment discussed above, however, as in the examples shown in FIGS. 1(a)–1(d), the bottom of the side-wall 26 may be composed of the silicon oxide layer or the silicon oxide nitride layer, or alternatively the side-wall 26 may be formed of the silicon oxide layer in place of the silicon nitride layer. Herein, if the side-wall 26 is formed of the silicon oxide layer replacing the silicon nitride layer, as shown in FIG. 2(b), the recessed portion 30 is formed by etching the upper layer 29, and thereafter the upper layer 29 is further etched so as to be removed as shown in FIG. 2(f). It is preferable in terms of obtaining the lower electrode 28 of a good quality that the cleaning and etching processes based on the dry-etching be executed after the above process.

As discussed above, the semiconductor device according to the present invention is constructed such that the bottom of the side-wall is composed of the silicon oxide layer or the silicon oxide nitride layer, and, even if the contact deviation occurs with the result that the side-wall directly contacts the gate electrode etc, the silicon nitride layer existing on the upper portion of the silicon oxide layer or the silicon oxide nitride layer does not come into a direct contact with the gate electrode because of the portion contacting the gate electrode being formed of the silicon oxide layer or the silicon oxide nitride layer. Accordingly, it is feasible to prevent such inconveniences that the transistor characteristic of the semiconductor device fluctuates due to the stress in the silicon nitride layer, the hydrogen existing in this layer and the interface level etc, or alternatively the junction leak current increases.

Further, the method of manufacturing the semiconductor device according to the present invention, involves forming the silicon oxide layer or the silicon oxide nitride layer on the surface of the silicon substrate that faces inwardly of the contact hole, forming the silicon nitride layer over the entire surface, and thereafter forming the side-wall composed of the silicon nitride layer and the silicon oxide layer or the silicon oxide nitride layer within the contact hole by executing the anisotropic etching process upon the silicon oxide layer and the silicon oxide layer or the silicon oxide nitride layer. Hence, even if the contact deviation is caused enough to have the gate electrode faced inwardly of the contact hole, the silicon nitride layer is formed after forming the silicon oxide layer or the silicon oxide nitride layer within the contact hole, thereby eliminating the possibility in which the silicon nitride layer for forming the side-wall does not come into a direct contact with the gate electrode. Accordingly, as discussed above, it is possible to prevent such inconveniences that the transistor characteristic of the obtained semiconductor device fluctuates and that the junction leak current augments.

Moreover, the semiconductor device according to the present invention is manufactured by the method of forming the recessed portion in such a state that the aperture of the contact hole faces to the outside, and thereafter forming the conductive layer in a state of being embedded into the contact hole as well as of covering the internal surface of the recessed portion, the method of forming the conductive layer in a state of covering the internal surface of the recessed portion in the obtained conductive layer, and the method of executing the etching process so that the portion covering the internal surface of the recessed portion in the obtained conductive layer is left and thereby enabling the portion covering the internal surface of this recessed portion to become the lower electrode of the cylinder type capacitor. Therefore, the lower electrode and the contact composed of the conductive layer embedded into the contact hole can be continuously integrally formed.

Moreover, according to these manufacturing methods, the embedding the conductive layer into the contact hole and into the recessed portion is carried out by one process, and hence the single patterning process based on the etching etc for forming the lower electrode and the contact may suffice. Accordingly, the manufacturing processes can be more simplified than by the prior art, whereby the manufacturing costs can be also reduced.

It is apparent that, in this invention, a wide range of different working modes can be formed based on the invention without deviating from the spirit and scope of the invention. This invention is not restricted by its specific working modes except being limited by the appended claims.

What is claimed is:

1. A method of manufacturing a semiconductor device of a DRAM type having a cylinder type capacitor, comprising:

forming a contact hole in an inter-layer insulating layer on a silicon substrate, said contact hole communicating with a conductive portion of said silicon substrate;

forming an upper layer on said inter-layer insulating layer and over said contact hole, so that said upper layer is embedded only within an upper portion of said contact hole and so that said upper layer is not embedded within a lower portion of said contact hole;

forming a recessed portion in said upper layer having an aperture larger than an aperture of said contact hole, by etching said upper layer, so that a step portion of said inter-layer insulating layer surrounding said contact hole within said recessed portion is exposed;

removing the upper portion of said upper layer within said contact hole; and embedding a contact material into said contact hole and covering an internal surface of said recessed portion with the contact material, an entirety of said contact hole being filled with the contact material.

2. The method of manufacturing a semiconductor device according to claim 1, further comprising:

forming said inter-layer insulating layer by depositing a silicon oxide layer and a silicon nitride layer in sequence; and forming, after said forming of said contact hole and before said forming of said upper layer, a side-wall along an inner wall surface of said contact hole.

3. The method of manufacturing a semiconductor device according to claim 2, wherein said side-wall is composed of a silicon nitride layer.

4. The method of manufacturing a semiconductor device according to claim 1, wherein said upper layer is composed of a silicon oxide layer into which phosphorus is doped with a silane series gas serving as a base.

5. The method of manufacturing a semiconductor device according to claim 2, wherein said upper layer is composed of a silicon oxide layer into which phosphorus is doped with a silane series gas serving as a base.

6. The method of manufacturing a semiconductor device according to claim 3, wherein said upper layer is composed of a silicon oxide layer into which phosphorus is doped with a silane series gas serving as a base.

7. The method of manufacturing a semiconductor device according to claim 1, wherein said upper layer is a silicon oxide layer and said forming an upper layer comprises a chemical vapor deposition process wherein the silicon oxide layer is doped with phosphorus within a range of 7 wt % to 14 wt % using a silane series gas as a base, so that the doped silicon oxide layer is embedded only within the upper portion of said contact hole.

* * * * *